United States Patent
Zou et al.

(10) Patent No.: US 10,770,162 B2
(45) Date of Patent: Sep. 8, 2020

(54) SHIFT REGISTER, DRIVING CIRCUIT AND DISPLAY DEVICE

(71) Applicant: Xiamen Tianma Micro-electronics Co., Ltd., Xiamen (CN)

(72) Inventors: Zongjun Zou, Xiamen (CN); Ying Sun, Xiamen (CN); Yumin Xu, Xiamen (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 170 days.

(21) Appl. No.: 16/036,072

(22) Filed: Jul. 16, 2018

(65) Prior Publication Data
US 2019/0333595 A1    Oct. 31, 2019

(30) Foreign Application Priority Data
Apr. 27, 2018 (CN) .......................... 2018 1 0394402

(51) Int. Cl.
| G11C 19/00 | (2006.01) |
| G11C 19/28 | (2006.01) |
| G09G 3/20 | (2006.01) |
| G09G 3/36 | (2006.01) |

(52) U.S. Cl.
CPC .............. *G11C 19/287* (2013.01); *G09G 3/20* (2013.01); *G09G 3/3677* (2013.01); *G11C 19/28* (2013.01); *G09G 2300/0809* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 7,215,315 | B2* | 5/2007 | Morosawa | G11C 19/00 345/100 |
| 8,019,039 | B1* | 9/2011 | Tsai | G11C 19/28 377/64 |
| 8,107,586 | B2* | 1/2012 | Shin | G09G 3/3677 377/64 |
| 8,390,560 | B2* | 3/2013 | Toyoshima | G09G 3/3611 327/333 |
| 8,633,888 | B2* | 1/2014 | Kim | G09G 3/344 345/100 |

(Continued)

FOREIGN PATENT DOCUMENTS

CN            105741807 A        7/2016

*Primary Examiner* — Tuan T Lam
(74) *Attorney, Agent, or Firm* — Anova Law Group PLLC

(57) ABSTRACT

A shift register, a driving circuit and a display device are provided. The shift register comprises an output circuit, a node control circuit, and a first node charging circuit. The output circuit provides a signal at a first clock signal terminal or a signal at a first reference voltage terminal to a gate signal output terminal under a control of a signal at a first node or a control of a signal at a second node. The node control circuit controls levels of the signal at the first node and at the second node to be opposite. The first node charging circuit includes a first control terminal, and provides a signal at a first fixed voltage terminal to the first node under a control of a signal at the first control terminal during a charging period of the first node in a non-scanning period.

16 Claims, 11 Drawing Sheets

(56) References Cited

U.S. PATENT DOCUMENTS

| | | | | |
|---|---|---|---|---|
| 8,923,473 B2* | 12/2014 | Sasaki | ............... | G09G 3/3677 |
| | | | | 377/64 |
| 2004/0140839 A1* | 7/2004 | Nagao | ............... | G11C 19/00 |
| | | | | 327/291 |
| 2007/0248204 A1* | 10/2007 | Tobita | ............... | G11C 19/28 |
| | | | | 377/64 |
| 2010/0214279 A1* | 8/2010 | Kim | ............... | G09G 3/344 |
| | | | | 345/213 |
| 2013/0156148 A1* | 6/2013 | Sasaki | ............... | G11C 19/184 |
| | | | | 377/64 |

* cited by examiner

SHIFT REGISTER, DRIVING CIRCUIT AND DISPLAY DEVICE

CROSS-REFERENCES TO RELATED APPLICATIONS

This application claims the priority of Chinese Patent Application No. 201810394402.2, filed on Apr. 27, 2018, the entire contents of which are incorporated herein by reference.

FIELD OF THE DISCLOSURE

The present disclosure generally relates to the display technology and, more particularly, relates to a shift register, a driving circuit, and a display device thereof.

BACKGROUND

In an existing display panel, gate lines in the display panel are often scanned line by line through a gate driving circuit, and thin-film transistors (TFTs) are controlled to be switched on to input data signals into pixels, thereby realizing a display function. The gate driving circuit often includes a plurality of cascaded shift registers, and each shift register is electrically connected to a corresponding gate line or scanning line.

However, due to current leakage in an existing shift register, an output terminal of the existing shift register may be unable to output a normal electrical signal, resulting in abnormal scanning of the corresponding gate line. In severe cases, the corresponding gate line may be unable to receive the scanning signal and, accordingly, the corresponding pixels may be unable to perform the display function, which leads to a dark line in which one row of pixels are not switched on. Thus, the display performance may be degraded.

The disclosed shift register, driving circuit, and display device thereof are directed to solve one or more problems set forth above and other problems.

BRIEF SUMMARY OF THE DISCLOSURE

One aspect of the present disclosure provides a shift register. The shift register comprises an output circuit, a node control circuit, and a first node charging circuit. The output circuit provides a signal at a first clock signal terminal or a signal at a first reference voltage terminal to a gate signal output terminal under a control of a signal at a first node or a control of a signal at a second node. The node control circuit controls levels of the signal at the first node and at the second node to be opposite. The first node charging circuit includes a first control terminal, and provides a signal at a first fixed voltage terminal to the first node under a control of a signal at the first control terminal during a charging period of the first node in a non-scanning period.

Another aspect of the present disclosure provides a driving circuit. The driving circuit comprises N number of cascaded shift registers, where N is a positive integer greater than two. A shift register of the N number of cascaded shift registers comprises an output circuit, a node control circuit, and a first node charging circuit. The output circuit provides a signal at a first clock signal terminal or a signal at a first reference voltage terminal to a gate signal output terminal under a control of a signal at a first node or a control of a signal at a second node. The node control circuit controls levels of the signal at the first node and at the second node to be opposite. The first node charging circuit includes a first control terminal, and provides a signal at a first fixed voltage terminal to the first node under a control of a signal at the first control terminal during a charging period of the first node in a non-scanning period.

Another aspect of the present disclosure provides a display device. The display device comprises a display region including a plurality of gate lines and a plurality of data line intersecting and insulated from the gate lines; and a non-display region including a driving circuit. The driving circuit comprises: N number of cascaded shift registers, where N is a positive integer greater than two. A shift register of the N number of cascaded shift registers comprises an output circuit, a node control circuit, and a first node charging circuit. The output circuit provides a signal at a first clock signal terminal or a signal at a first reference voltage terminal to a gate signal output terminal under a control of a signal at a first node or a control of a signal at a second node. The node control circuit controls levels of the signal at the first node and at the second node to be opposite. The first node charging circuit includes a first control terminal, and provides a signal at a first fixed voltage terminal to the first node under a control of a signal at the first control terminal during a charging period of the first node in a non-scanning period. The gate signal output terminal of the shift register is electrically connected to a correspond gate line of the plurality of gate lines.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
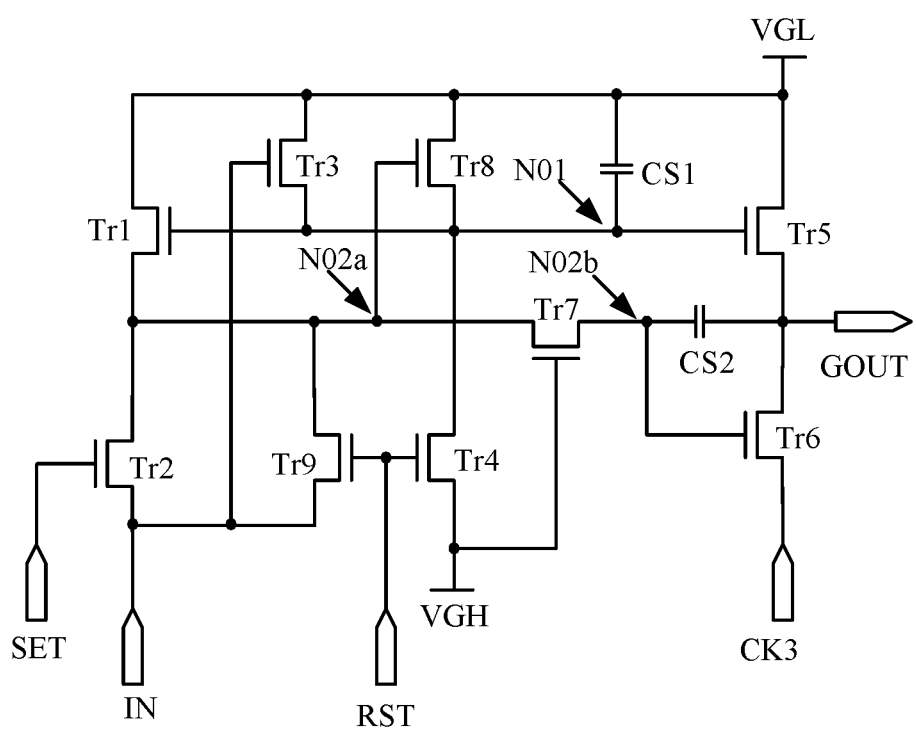
FIG. 1 illustrates a circuit diagram of an existing shift register.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Figure 2:
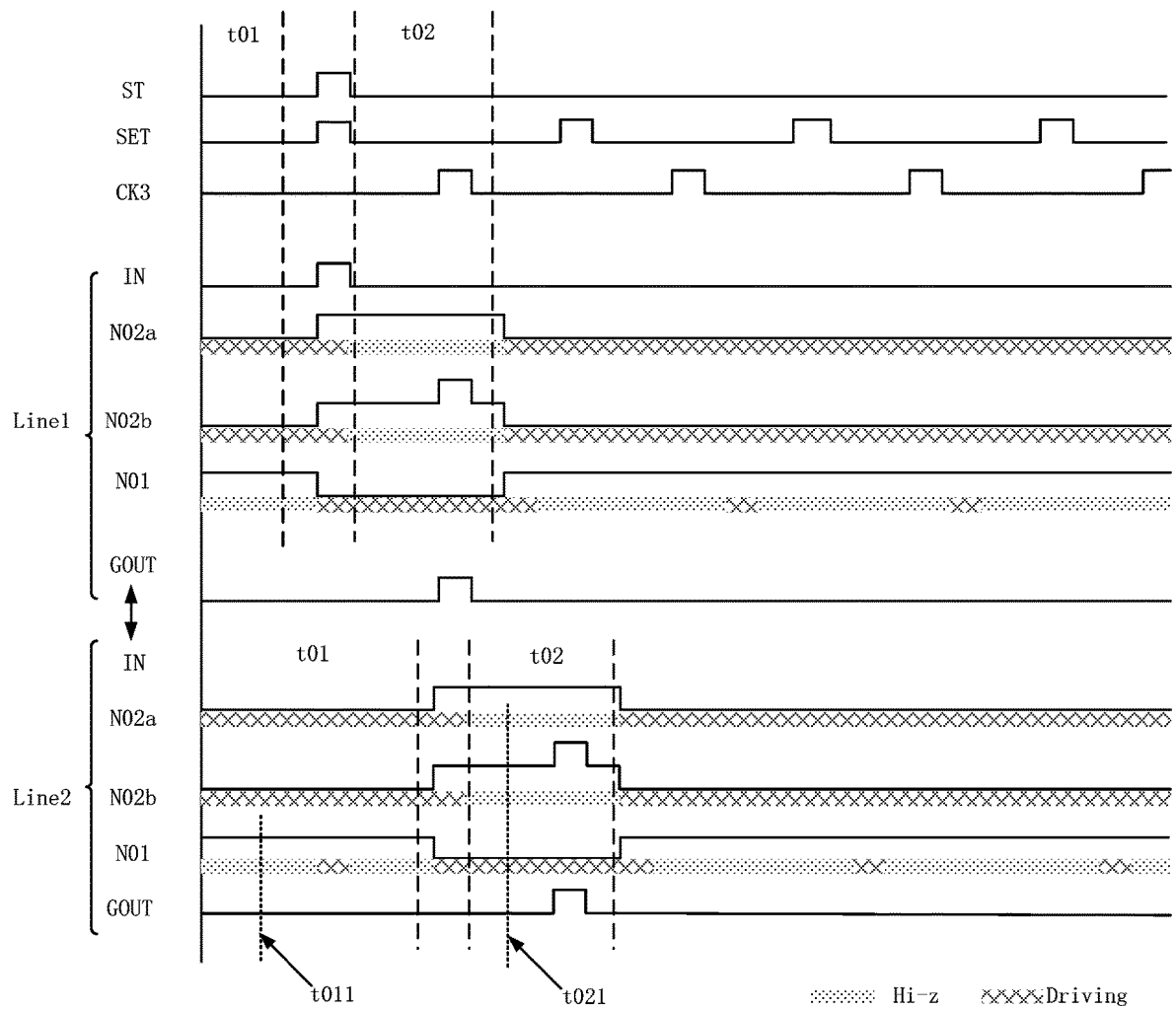
FIG. 2 illustrates a timing diagram of an existing shift register in FIG. 1.

FIG. 1 illustrates a circuit diagram of an existing shift register, and FIG. 2 illustrates a timing diagram of an existing shift register in FIG. 1. As shown in FIG. 1, the shift register includes transistors Tr1 to Tr9, a capacitor CS1, and a capacitor CS2. During the charging period t01 of a node N01, the node N01 is charged to a high-level, thereby controlling the transistor Tr5 to be switched on, and an output terminal GOUT outputs the electrical signal at a low-level signal terminal VGL. During the charging period t02 of a node N02b, the node N02b is charged to a high-level, thereby controlling the transistor Tr6 to be switched on, and the output terminal GOUT outputs the electrical signal at a clock signal terminal CK3. The high-level signal outputted by the output terminal GOUT is a scanning signal, which is outputted to a corresponding gate line to control the display panel to realize the display function. In particular, the transistor Tr7 is always in a switched-on state under the control of the high-level signal terminal VGH and, thus, the charging period of the node N02a and the node N02b node is the same period.

When the existing shift register is implemented into the display panel, the operation state of the shift register includes a scanning period and a non-scanning period. During the non-scanning period, the output terminal of the shift register suspends the output of the scanning signal, and the gate line temporarily does not receive the scanning signal, during which the display panel stops executing the display function, instead, performs other functions such as a touch detection function.

When the shift register suspends the output of the scanning signal to the gate line at the moment t021 to enter the non-scanning period, in which the moment t021 is located in the charging period t02 of the node N02b, the node N02a and the node N02b are in a floating state (Hi-z) rather than a normal driving state (Driving). That is, the node N02a and the node N02b maintain the high-level of the previous moment through the capacitor CS2, but without being provided with electrical signal by a continuous voltage source. Thus, the potentials of the node N02a and the node N02b will gradually decrease. Accordingly, the transistor Tr6 may not be switched on sufficiently after the shift register resumes scanning, and the output terminal GOUT may be unable to output the electrical signal at the clock signal terminal CK3 normally, resulting in abnormal scanning of the corresponding gate line. In severe cases, the corresponding gate line may be unable to receive the scanning signal and, accordingly, the corresponding pixels may be unable to perform the display function, which leads to a dark line in which one row of pixels are not switched on. Thus, the display performance may be degraded.

The present disclosure provides an improved shift register, which may be capable of suppressing the abnormal output signal at the shift register when the shift register reenters the scanning period, and improving the display performance.

Figure 3:
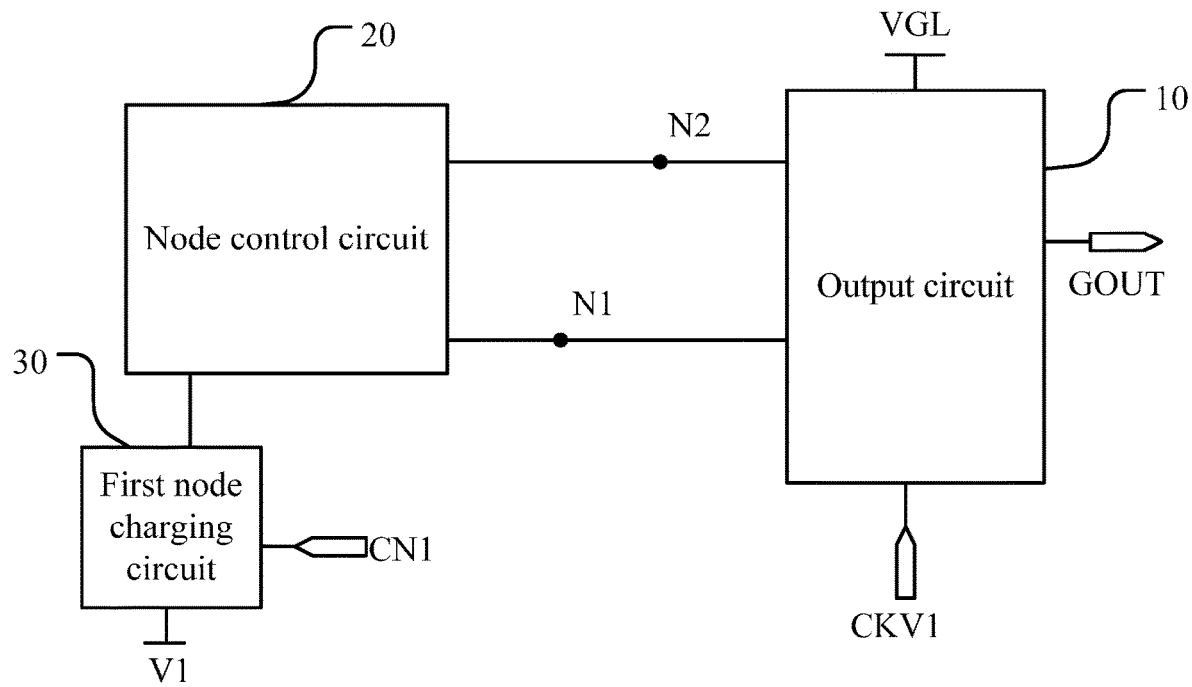
FIG. 3 illustrates a schematic diagram of an exemplary shift register consistent with disclosed embodiments.

FIG. 3 illustrates a schematic diagram of an exemplary shift register consistent with disclosed embodiments. The shift register may comprise a plurality of transistors and a plurality of capacitors, and the plurality of transistors and the plurality of capacitors may form a plurality of circuits in the shift register.

As shown in FIG. 3, the shift register may comprise an output circuit 10, a node control circuit 20, and a first node charging circuit 30. In particular, the output circuit 10 may provide a signal at a first clock signal terminal CKV1 to a gate signal output terminal GOUT under the control of the signal at a first node N1, or provide a signal at a first reference voltage terminal VGL to the gate signal output terminal GOUT under the control of the signal at a second node N2. According to the signal at the first node N1 or the signal at the second node N2, the node control circuit 20 may control the level of the signal at the first node N1 to be opposite to the level of the signal at the second node N2.

The first node charging circuit 30 may include a first control terminal CN1. When the shift register is implemented into the display panel, the operation state of the shift register includes a scanning period and a non-scanning period. During a charging period of the first node N1 in the non-scanning period, the first node charging circuit 30 may provide a signal at a first fixed voltage terminal V1 to the first node N1 under the control of the signal at the first control terminal CN1.

In the disclosed embodiments, the non-scanning period of the shift register may be a period during which the shift register suspends the output of the scanning signal to the gate line, and instead, for example, a touch control function may be performed. During the charging period of the first node N1 in the non-scanning period of the shift register, the shift register may suspend the output of the scanning signal to the gate line to start the non-scanning period of the shift register. Thus, during the non-scanning period of the shift register, the first node N1 may still have to maintain a charging status.

In the disclosed embodiments, through configuring the first node charging circuit 30 in the shift register, during the charging period of the first node N1 in the non-scanning period, the first node charging circuit 30 may provide the signal at the first fixed voltage terminal V1 to the first node N1 under the control of the signal at the first control terminal CN1. Thus, the first node N1 may be no longer in the floating state during the non-scanning period, and the electrical signal at the first fixed voltage terminal V1 may be able to continuously charge the first node N1, thereby maintaining the potential of the first node N1. That is, the potential of the first node may not decrease due to the current leakage.

When the shift register recovers from the non-scanning period to the scanning period to be normally operated to output the scanning signal to the gate line, because the potential of the first node N1 remains substantially the same under the influence of the first node charging circuit 30, the output circuit 10 may be able to provide the signal at the first clock signal terminal CKV1 to the gate signal output terminal GOUT under the control of the signal at the first node N1. Thus, the shift register may normally output the scanning signal to the gate line. Accordingly, the abnormal output signal at the shift register may be suppressed when the shift register reenters the scanning period, and the phenomenon of the dark lines may be improved.

Referring to FIG. 1 and FIG. 2, the researchers further found that in the existing technologies, when the shift register pauses the output of the scanning signal to the gate line at the moment t011 to enter the non-scanning period, in which the moment t011 is located in the charging period t01 of node N01b, the node N01 with the high-level is in the floating state (Hi-z). That is, the node N01 maintains the high-level of the previous moment through the capacitor CS1, but without being provided with an electrical signal by a continuous voltage source. Further, due to the current leakage, the potential of the node N01a will gradually decrease.

Thus, after the shift register recovers from the non-scanning period to the scanning period, the transistor Tr5 may not be switched on sufficiently, and the output terminal GOUT may be unable to normally output the electrical signal at the low-level signal terminal VGL. Instead, the output terminal GOUT may still maintain the high-level signal at the clock signal terminal CK3 obtained at the previous moment. Thus, the corresponding gate line may maintain receiving the high-level signal for long time, and the corresponding pixels may receive abnormal signals. Accordingly, a bright line caused by prolonged charging time of one row of pixels (i.e., one pixel row) may appear on the display panel, resulting abnormal display function and degrading the display performance.

Figure 4:
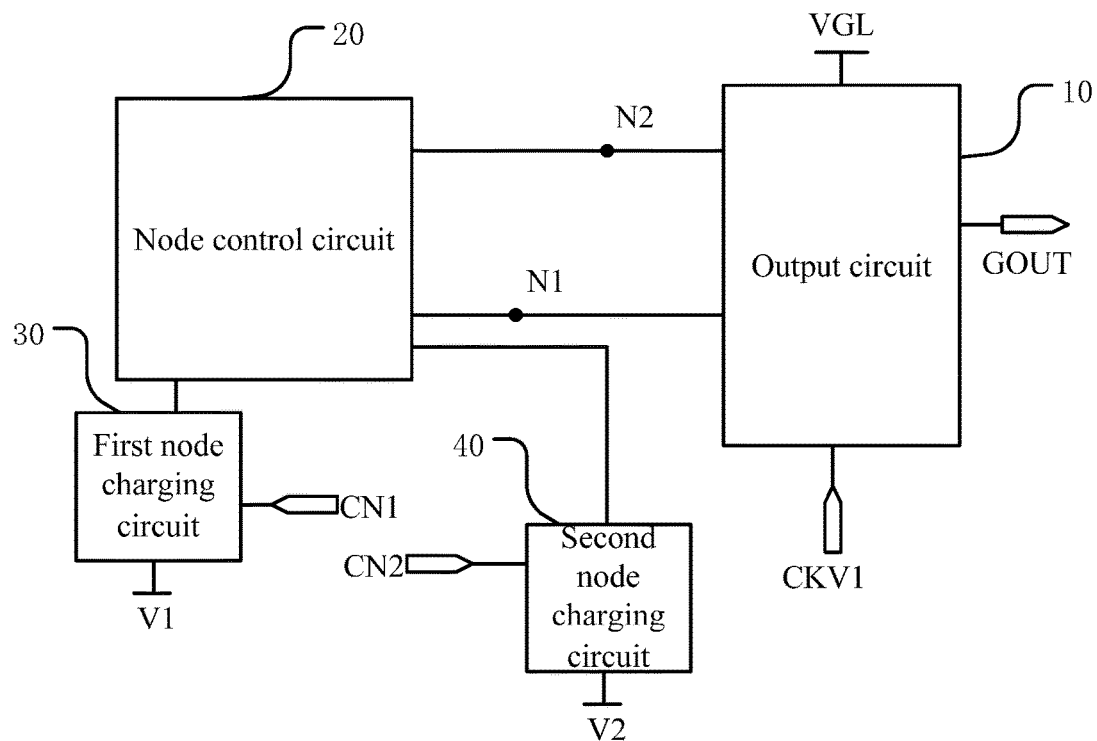
FIG. 4 illustrates a schematic diagram of another exemplary shift register consistent with disclosed embodiments.

In view of this, FIG. 4 illustrates a schematic diagram of another exemplary shift register consistent with disclosed embodiments. The similarities between FIG. 3 and FIG. 4 are not repeated here, while certain differences may be explained.

As shown in FIG. 4, the shift register may further comprise a second node charging circuit 40, and the second node charging circuit 40 may include a second control terminal CN2. During the charging period of the second node N2 in the non-scanning period, under the control of the signal at the second control terminal CN2, the second node charging circuit 40 may provide an electrical signal at a second fixed voltage terminal V2 to the second node N2.

In the disclosed embodiments, the non-scanning period of the shift register may be a period during which the shift register suspends the output of the scanning signal to the gate line. During the charging period of the second node N2 in the non-scanning period of the shift register, the shift register may suspend the output of the scanning signal to the gate line to start the non-scanning period of the shift register. Thus, during the non-scanning period, the second node N2 may still have to maintain a charging status.

In the disclosed embodiments, through configuring the second node charging circuit 40 in the shift register, during the charging period of the second node N2 in the non-scanning period, the second node charging circuit 40 may provide the signal at the second fixed voltage terminal V2 to the second node N2 under the control of the signal at the second control terminal CN2. Thus, the second node N2 may be no longer in the floating state during the non-scanning period, and the electrical signal at the second fixed voltage terminal V2 may be able to continuously charge the second node N1, thereby maintaining the potential of the second node N1. That is, the potential of the second node N2 may not decrease due to the current leakage.

When the shift register recovers from the non-scanning period to the scanning period to be normally operated to output the scanning signal to the gate line, because the potential of the second node N2 remains substantially the same under the influence of the second node charging circuit 40, the output circuit 10 may be able to provide the signal at the first reference voltage terminal VGL to the gate signal output terminal GOUT under the control of the signal at the second node N2. Thus, the signal received by the gate line may promptly change from the scanning signal at the previous moment to the signal at the first reference voltage terminal VGL in time. Accordingly, the display abnormality caused by the prolonged time of receiving the scanning signal may be prevented, the abnormal output signal when the shift register reenters the scanning period may be suppressed, and the phenomenon of bright lines may be improved.

Figure 5:
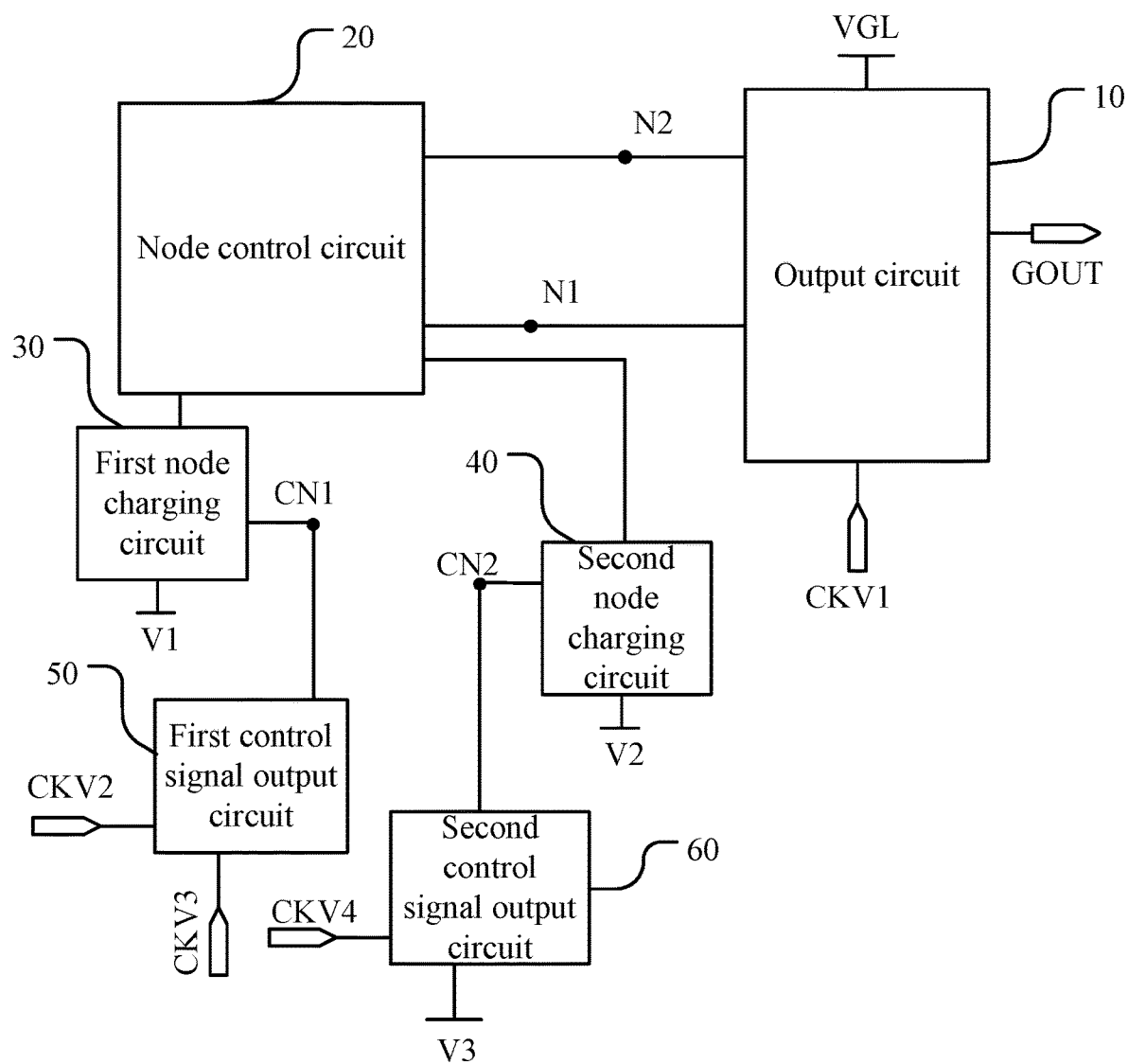
FIG. 5 illustrates a schematic diagram of another exemplary shift register consistent with disclosed embodiments.

FIG. 5 illustrates a schematic diagram of another exemplary shift register consistent with disclosed embodiments. The similarities between FIG. 4 and FIG. 5 are not repeated here, while certain differences may be explained.

As shown in FIG. 5, the shift register may further comprise a first control signal output circuit 50. Under the control of the signal at the second clock signal terminal CKV2, the first control signal output circuit 50 may transmit a signal at the third clock signal terminal CKV3 to the first control terminal CN1, such that the first node charging circuit 30 may be able to provide the electrical signal at the first fixed voltage terminal V1 to the first node N1.

In the disclosed embodiments, through configuring the first control signal output circuit 50 in the shift register, the first control signal output circuit 50 may be able to provide an electrical signal to the first control terminal CN1. That is, the first control terminal CN1 may receive the electrical signal provided by the first control signal output circuit 50, such that during the charging period of the first node in the non-scanning period. The electrical signal at the first fixed voltage terminal V1 may be provided to the first node N1.

In one embodiment, as shown in FIG. 5, the shift register may further include a second control signal output circuit 60. Under the control of the signal at the fourth clock signal terminal CKV4, the second control signal output circuit 60 may transmit a signal at the third fixed voltage terminal V3 to the second control terminal CN2, such that the second node charging circuit 40 may be able to provide the electrical signal at the second fixed voltage terminal V2 to the second node N2.

In the disclosed embodiments, through configuring the second control signal output circuit 60 in the shift register, the second control signal output circuit 60 may be able to provide an electrical signal to the second control terminal CN2. That is, the second control terminal CN2 may receive the electrical signal provided by the second control signal output circuit 60, such that during the charging period of the second node N2 in the non-scanning period. The electrical signal at the second fixed voltage terminal V2 may be provided to the second node N2. In one embodiment, the third fixed voltage terminal V3 may provide a high-level signal.

In the following, exemplary structures of the various circuits in the shift register will be described.

It should be noted that, in the disclosed embodiments, according to the type of the transistor and the signal at the gate electrode of the transistor, the first electrode and the second electrode of the transistor may be a source electrode and a drain electrode, respectively, or the first electrode and the second electrode of the transistor may be a drain electrode and a source electrode, respectively, which may be determined according to various application scenarios.

Further, transistors are often divided into N-type transistors and P-type transistors. An N-type transistor is switched on under the control of the high-level signal and switched off under the control of the low-level signal, while a P-type transistor is switched on under the control of the low-level signal and switched off under the control of the high-level signal.

In the disclosed embodiments, the transistors included in the shift register are all N-type transistors, which is for illustrative purposes and is not intended to limit the scope of the present disclosure. In the following description of exemplary structures of the various circuits in the shift register, the charging period of the first node N1 refers to a period during which the first node is charged to the high-level, and the charging period of the second node N2 refers to a e period during which the second node N2 is charged to the high-level.

Figure 6:
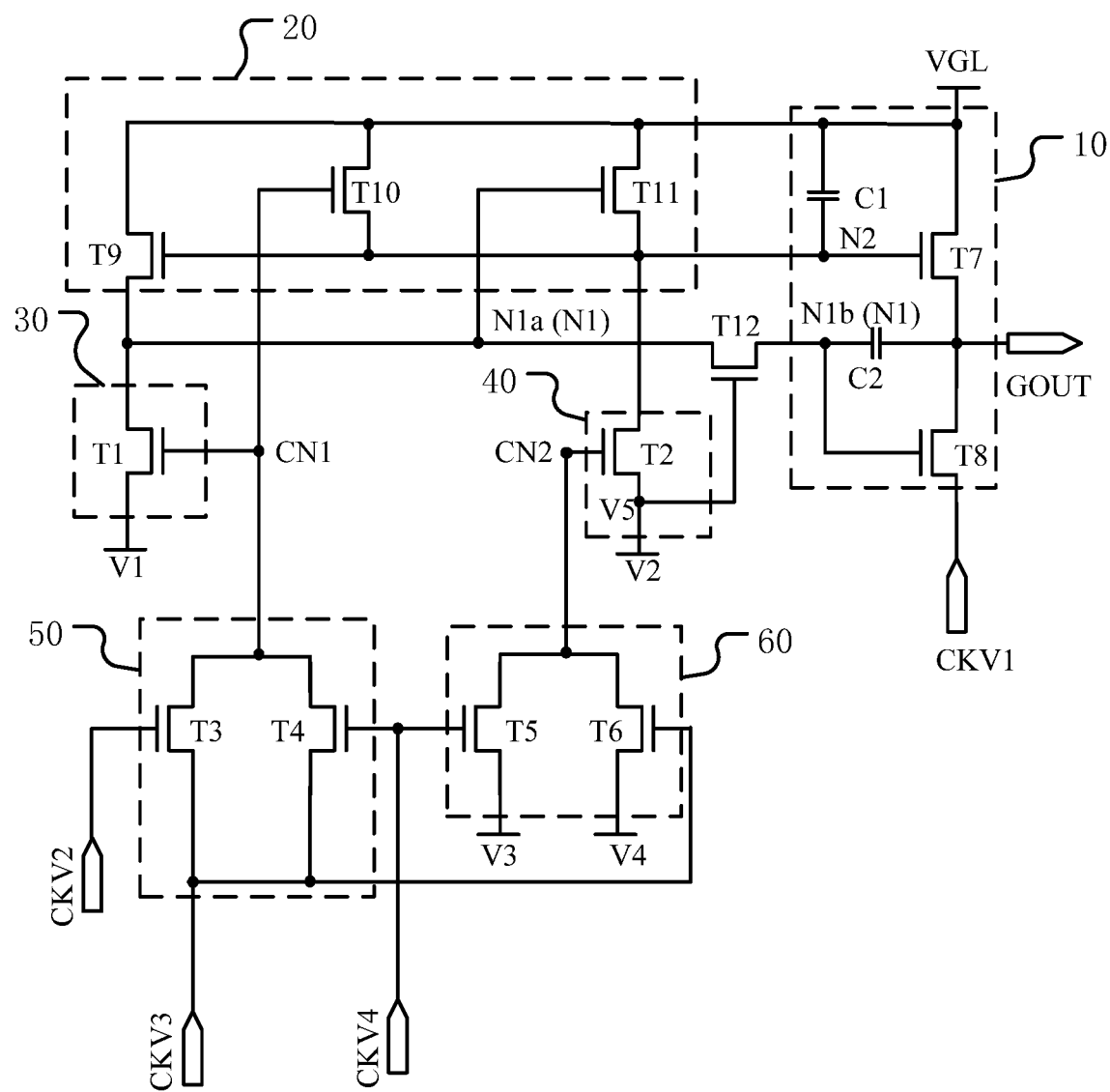
FIG. 6 illustrates a circuit diagram of another exemplary shift register consistent with disclosed embodiments.

FIG. 6 illustrates a circuit diagram of another exemplary shift register consistent with disclosed embodiments. As shown in FIG. 6, the shift register may comprise a first node charging circuit 30, a first control signal output circuit 50, a second node charging circuit 40, a second control signal output circuit 60, an output circuit 10, a node control circuit 20, and a twelfth transistor T12.

The first node charging circuit 30 may include a first transistor T1. A gate electrode of the first transistor T1 may be electrically connected to the first control terminal CN1, a first electrode of the first transistor T1 may be electrically connected to the first fixed voltage terminal V1, and a second electrode of the first transistor T1 may be electrically connected to the first node N1.

The electrical signal at the first control terminal CN1 may control the switching-on and switching-off of the first transistor T1. When the first transistor T1 is switched on, the electrical signal at the first fixed voltage terminal V1 may be transmitted to the first node N1. In one embodiment, the first fixed voltage terminal V1 may provide a high-level signal.

The first control signal output circuit 50 may include a third transistor T3 and a fourth transistor T4. A gate electrode of the third transistor T3 may be electrically connected to the second clock signal terminal CKV2, a first electrode of the third transistor T3 may be electrically connected to the third clock signal terminals CKV3, and a second electrode of the third transistor T3 may be electrically connected to the first control terminal CN1.

A gate electrode of the fourth transistor T4 may be electrically connected to the fourth clock signal terminal CKV4, a first electrode of the fourth transistor T4 may be electrically connected to the third clock signal terminals CKV3, and a second electrode of the fourth transistor T4 may be electrically connected to the first control terminal CN1.

The second clock signal terminal CKV2 may control the switching-on and switching-off of the third transistor T3. When the third transistor T3 is switched on, the electrical signal at the third clock signal terminal CKV3 may be transmitted to the first control terminal CN1. The fourth clock signal terminal CKV4 may control the switching-on and switching-off of the fourth transistor T4. When the fourth transistor T4 is switched on, the electrical signal at the third clock signal terminal CKV3 may be transmitted to the first control terminal CN1. The signal at the second clock signal terminal CKV2, the signal at the third clock signal terminal CKV3, and the signal at the fourth clock signal terminal CKV4 may be all pulse signals.

The second node charging circuit 40 may include a second transistor T2. A gate electrode of the second transistor T2 may be electrically connected to the second control terminal CN2, a first electrode of the second transistor T2 may be electrically connected to the second fixed voltage terminal V2, and a second electrode of the second transistor T2 may be electrically connected to the second node N2.

The electrical signal at the second control terminal CN2 may control the switching-on and switching-off of the second transistor T2. When the second transistor T2 is switched on, the electrical signal at the second fixed voltage terminal V2 may be transmitted to the second node. N2. In one embodiment, the second fixed voltage terminal V2 may provide a high-level signal.

The second control signal output circuit 60 may include a fifth transistor T5 and a sixth transistor T6. A gate electrode of the fifth transistor T5 may be electrically connected to the fourth clock signal terminal CKV4, a first electrode of the fifth transistor T5 may be electrically connected to the third fixed voltage terminal V3, and a second electrode of the fifth transistor T5 may be electrically connected to the second control terminal CN2. A gate electrode of the sixth transistor T6 may be electrically connected to the third clock signal terminal CKV3, a first electrode of the sixth transistor T6 may be electrically connected to the fourth fixed voltage terminal V4, and a second electrode of the sixth transistor T6 may be electrically connected to the second control terminal CN2.

The electrical signal at the fourth clock signal terminal CKV4 may control the switching-on and switching-off of the fifth transistor T5. When the fifth transistor T5 is switched on, the electrical signal at the third fixed voltage terminal V3 may be transmitted to the second control. CN2. The electrical signal at the third clock signal terminal CKV3 may control the switching-on and switching-off of the sixth transistor T6. When the sixth transistor T6 is switched on, the electrical signal at the fourth fixed voltage terminal V4 may be transmitted to the second control terminal CN2. In one embodiment, the fourth fixed voltage terminal V4 may provide a low-level signal.

The output circuit 10 may include a seventh transistor T7, an eighth transistor T8, a first capacitor C1, and a second capacitor C2. A gate electrode of the seventh transistor T7 may be electrically connected to the second node N2, a first electrode of the seventh transistor T7 may be electrically connected to the first reference voltage terminal VGL, and a second electrode of the seventh transistor T7 may be electrically connected to the gate signal output terminal GOUT. A first plate of the first capacitor C1 may be electrically connected to the first reference voltage terminal VGL, and a second plate of the first capacitor C1 may be electrically connected to the second node N2. A gate electrode of the eighth transistor T8 may be electrically connected to the first node N1, a first electrode of the eighth transistor T8 may be electrically connected to the first clock signal terminal CKV1, and a second electrode of the eighth transistor T8 may be electrically connected to the gate signal output terminal GOUT. A first plate of the second capacitor C2 may be electrically connected to the first node N1, and a second plate of the second capacitor C2 may be electrically connected to the gate signal output terminal GOUT.

The first capacitor C1 and the second capacitor C2 may have a coupling function and may stabilize the electrical potentials at the first node N1 and the second node N2.

The node control circuit 20 may include a ninth transistor T9, a tenth transistor T10 and an eleventh transistor T11. A gate electrode of the ninth transistor T9 may be electrically connected to the second node N2, a first electrode of the ninth transistor T9 may be electrically connected to the first reference voltage terminal VGL, and a second electrode of the ninth transistor T9 may be electrically connected to the first node N1. A gate electrode of the tenth transistor T10 may be electrically connected to the first control terminal CN1, a first electrode of the tenth transistor T10 may be electrically connected to the first reference voltage terminal VGL, and a second electrode of the tenth transistor T10 may be electrically connected to the second node N2.

A gate electrode of the eleventh transistor T11 may be electrically connected to the first node N1, a first electrode of the eleventh transistor T11 may be electrically connected to the first reference voltage terminal VGL, and a second electrode of the eleventh transistor T11 may be electrically connected to the second node N2.

The node control circuit 20 may control the electrical potentials of the first node N1 and the second node N2 to be opposite, such that one of the seventh transistor T7 (controlled by the first node N1) and the eighth transistor T8 (controlled by the second node N2) may be switched on while the other of the seventh transistor T7 and the eighth transistor T8 may be switched off. Correspondingly, the gate signal output terminal GOUT may output the electrical signal at the first reference voltage terminal VGL or the electrical signal at the first clock signal terminal CKV1, thereby ensuring that the gate signal output terminal GOUT does not simultaneously output the electrical signal at the first reference voltage terminal VGL and the electrical signal at the first clock signal terminal CKV1.

In one embodiment, the shift register may further include a twelfth transistor T12. The first node N1 may be divided into a first sub-node N1a and a second sub-node N1b by the twelfth transistor T12. A first electrode of the twelfth transistor T12 may be electrically connected to the first sub-node N1a, a second of the twelfth transistor T12 may be electrically connected to the second sub-node N2a, and a gate electrode of the twelfth transistor T12 may be electrically connected to a fifth fixed voltage terminal V5. The signal at the fifth fixed voltage terminal V5 may control the twelfth transistor T12 to be always switched-on. For example, the twelfth transistor T12 may be an N-type transistor, then the fifth fixed voltage terminal V5 may provide a high-level signal to control the twelfth transistor T12 to be always switched-on. As long as the gate electrode of the twelfth transistor T12 is electrically connected to VGH, the fifth fixed voltage terminal V5 may be any one of the first fixed voltage terminal V1, the second fixed voltage terminal V2 and the third fixed voltage terminal V3, as long as. In one embodiment, as shown in FIG. 6, the fifth fixed voltage terminal V5 may be the second fixed voltage terminal V2.

In certain embodiments, the gate electrode of the twelfth transistor T12 may be electrically connected to the first fixed voltage terminal V1 or the second fixed voltage terminal V2. In one embodiment, as shown in FIG. 6, the gate of the twelfth transistor T12 may be electrically connected to second fixed voltage terminal V2.

Figure 7:
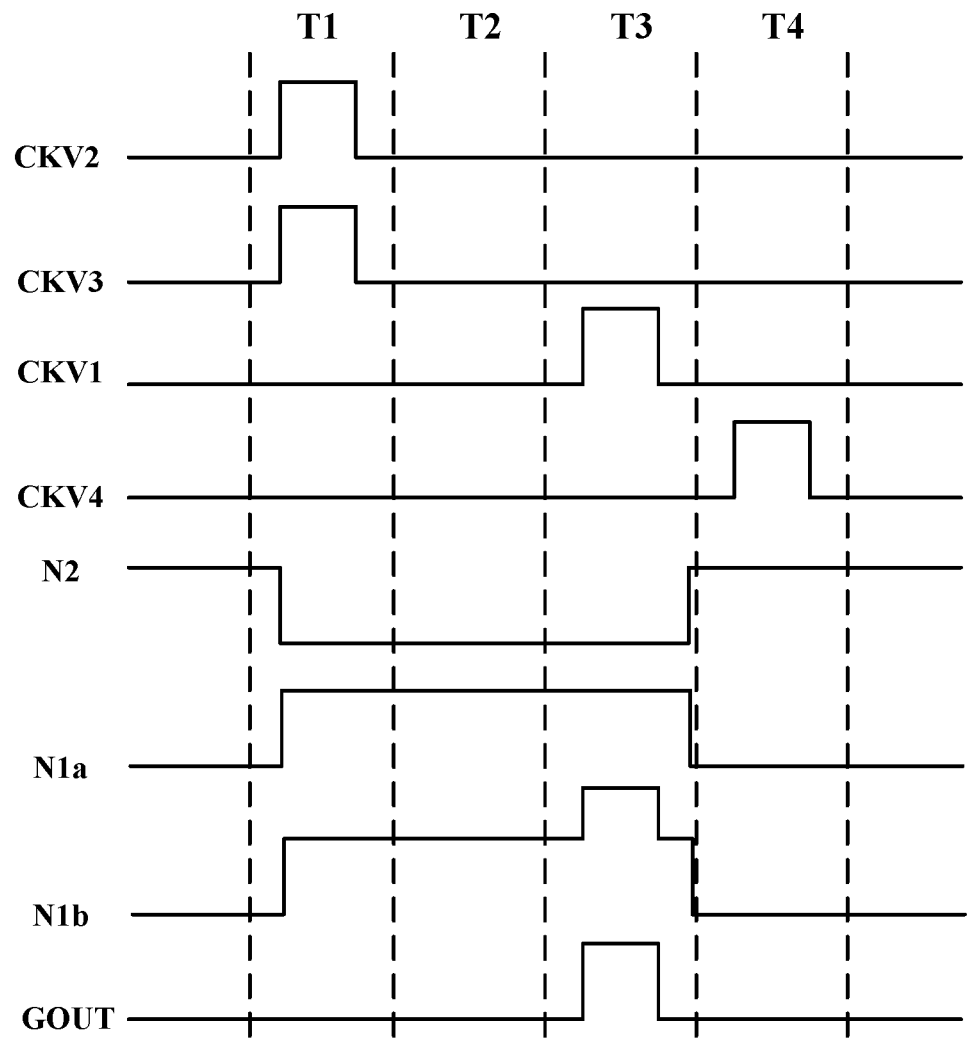
FIG. 7 illustrates an exemplary timing diagram of another exemplary shift register in FIG. 6 consistent with disclosed embodiments.

FIG. 7 illustrates an exemplary timing diagram of another exemplary shift register in FIG. 6 consistent with disclosed embodiments. In the following description, 1 represents the high-level signal, and 0 represents the low-level signal, where 1 and 0 represent the logic level thereof, which is only for better explaining the operation process of the disclosed shift register, instead of the level applied to the gate electrode of each transistor in the implementation.

As shown in FIG. 7, the timing diagram of another exemplary shift register in FIG. 6 may include four stages T1-T4. In the T1 stage, CKV2=1, CKV3=1, CKV1=0, and CKV4=0. Thus, the third transistor T3 may be switched on and the high-level signal at the third clock signal terminal CKV3 may be transmitted to the first control terminal CN1.

The high-level signal at the first control terminal CN1 may control the first transistor T1 to be switched on. The high-level signal at the first fixed voltage terminal V1 may be transmitted to the first sub-node N1a, then transmitted to the second sub-node N1b through the twelfth transistor T12. The eighth transistor T8 may be switched on, the signal at the first clock signal terminal CKV1 may be supplied to the gate signal output terminal GOUT, then the gate signal output terminal GOUT may output a low-level signal.

The fifth transistor T5 may be switched off, the sixth transistor T6 may be s switched on, and the low-level signal at the fourth fixed voltage terminal V4 may be transmitted to the second control terminal CN2. The low-level signal at the second control terminal CN2 may control the second transistor T2 to be switched off. The high-level signal at the first control terminal CN1 may control the tenth transistor T10 to be switched on, the high-level signal at the first sub-node N1a may control the eleventh transistor T11 to be switched on, and the low-level signal at the first reference voltage VGL may be transmitted to the second node N2. The ninth transistor T9 and the seventh transistor T7 may be switched off, and the electrical potential at the first node N1 may be opposite to the electrical potential at the second node N2.

In the T2 stage, CKV2=0, CKV3=0, CKV1=0, and CKV4=0. Thus, the third transistor T3, the fourth transistor T4, the fifth transistor T5, and the sixth transistor T6 may be all switched off. The first control terminal CN1 may be in the floating state and still maintain the high-level signal obtained at the first stage T1, and the first transistor T1 may still maintain the switched-on state under the control of the high-level signal at the first control terminal CN1. The high-level signal at the first fixed voltage terminal V1 may be continuously transmitted to the first sub-node N1a, and then transmitted to the second sub-node N1b through the twelfth transistor T12. The eighth transistor T8 may be switched on, the signal at the first clock signal terminal CKV1 may be supplied to the gate signal output terminal GOUT, and the gate signal output terminal GOUT may output a low-level signal.

The second control terminal CN2 may be in a floating state and still maintain the low-level signal obtained at the first stage T1. The low-level signal at the second control terminal CN2 may control the second transistor T2 to be switched off. The tenth transistor T10 may maintain the switched-on state under the control of the high-level signal at the first control terminal CN1, and the high-level signal at the first sub-node N1a may control the eleventh transistor T11 to remain switched-on. The low-level signal at the first reference voltage VGL may be continuously transmitted to the second node N2, and the ninth transistor T9 and the seventh transistor T7 may be switched off, and the electrical potential at the first node N1 may opposite to the electrical potential at the second node N2.

In the T3 stage, CKV2=0, CKV3=0, CKV1=1, and CKV4=0. Thus, the third transistor T3, the fourth transistor T4, the fifth transistor T5, and the sixth transistor T6 may be all switched off. The first control terminal CN1 may be in the floating state and still maintain the high-level signal obtained at the second stage T2. The first transistor T1 may still maintain the switched-on state under the control of the high-level signal at the first control terminal CN1. The high-level signal at the first fixed voltage terminal V1 may be continuously transmitted to the nail node N1a, and then transmitted to the second sub-node N1b through the twelfth transistor T12. The eighth transistor T8 may be switched on, the signal at the first clock signal terminal CKV1 may be provided to the gate signal output terminal GOUT, and the gate signal output terminal GOUT may output a high signal. The high-level signal outputted from the gate signal output terminal GOUT may be a scanning signal.

The second control terminal CN2 may be in the floating state and still maintain the low-level signal obtained at the second time T2, and the low-level signal at the second control terminal CN2 may control the second transistor T2 to be switched off. The tenth transistor T10 may maintain in the switched-on state under the control of the high-level signal at the first control terminal CN1, and the high-level signal at the first sub-node N1a may control the eleventh transistor T11 to remain switched-on. The low-level signal at the first reference voltage VGL may be continuously transmitted to the second node N2, and the ninth transistor T9 and the seventh transistor T7 may be switched off. The electrical potential at the first node N1 may be opposite to the electrical potential at the second node N2.

In the T4 stage, CKV2=0, CKV3=0, CKV1=0, and CKV4=1. Thus, the fourth transistor T4 and the fifth transistor T5 may be switched on, and the third transistor T3 and the sixth transistor T6 may be switched off. The low-level signal at the third clock signal terminal CKV3 may be transmitted to the first control terminal CN1 through the fourth transistor T4. The low-level signal at the first control terminal CN1 may control the first transistor T1 to be switched-off, and the high-level signal at the first fixed voltage terminal V1 may stop being transmitted to the first sub-node N1a and the second sub-node N1b. The high-level signal at the third fixed voltage terminal V3 may be transmitted to the second control terminal CN2 through the fifth transistor T5. The high-level signal at the second control terminal CN2 may control the second transistor T2 to be switched on, and the high-level signal at the second fixed voltage terminal V2 may be transmitted to the second node N2.

The high-level signal at the second node N2 may control the ninth transistor T9 to be switched on. The low-level signal at the first reference voltage terminal VGL may be transmitted to the first sub-node N1a, then transmitted to the second sub-node N1b through the twelfth transistor T12. The electrical potential at the first node N1 may be opposite to the electrical potential at the second node N2. The seventh transistor T7 may be switched on under the control of the high-level signal at the second node N2, the eighth transistor T8 may be switched off under the control of the low-level signal at the second sub-node N1b, and the low-level signal at the first reference voltage terminal VGL may be transmitted to the gate signal output terminal GOUT through the switched-on seventh transistor T7. That is, the gate signal output terminal GOUT may output the low-level signal.

Figure 8:
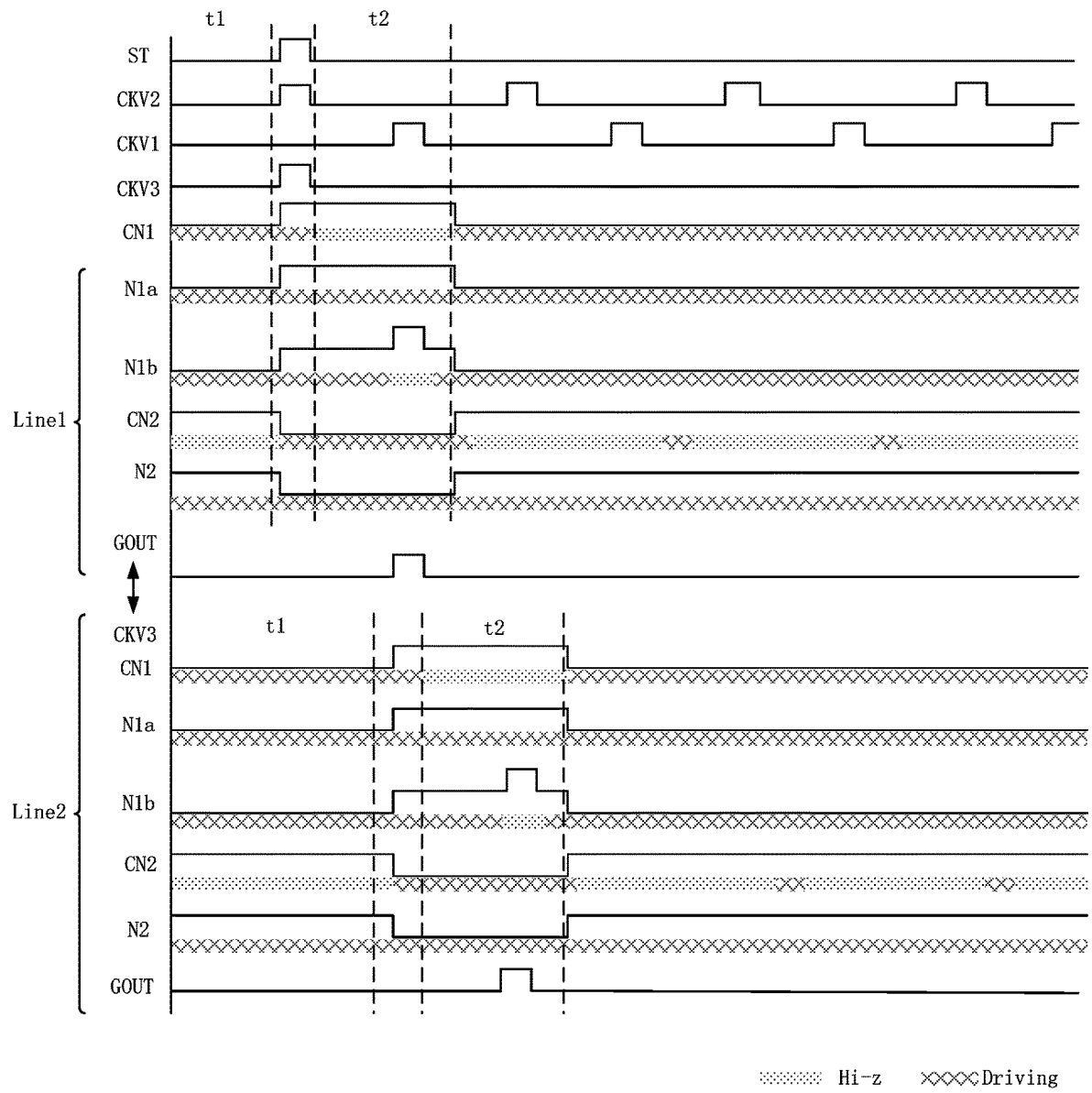
FIG. 8 illustrates another exemplary timing diagram of another exemplary shift register in FIG. 6 consistent with disclosed embodiments.

FIG. 8 illustrates another exemplary timing diagram of another exemplary shift register in FIG. 6 consistent with disclosed embodiments. As shown in FIG. 8, during the charging period t2 of the first node N1, the first node N1 may maintain the normal driving state (Driving). Compared with the existing technologies, the floating state (Hi-z) of the first node N1 in the existing technologies is now transferred to the first control terminal CN1 in the disclosed embodiments. That is, in the disclosed embodiments, the first control terminal CN1 may be in the floating state (Hi-z). In particular, the charging period t2 of the first node N1 may include the aforementioned T2 stage and T3 stage. During the charging period t1 of the second node N2, the second node N2 may maintains the normal driving state (Driving). Compared with the existing technologies, the floating state (Hi-z) of the second node N2 in the existing technologies is now transferred to the second controlling terminal CN2. That is, in the disclosed embodiments, second controlling terminal CN2 may be in the floating state (Hi-z). In particular, the charging period t1 of the second node N2 may include the aforementioned T4 stage.

Any disclosed shift registers may be implemented into a display panel. When the display panel is operated, during the charging period of the first node N1 in the non-scanning period, i.e., during the T1 to T3 stages in which the shift register suspends the output of the scanning signal, the high-level signal at the first control terminal CN1 may control the first transistor T1 to be switched on. The high-level signal at the first fixed voltage terminal V1 may continuously charge the first node N1, and maintain the high potential at the first node N1, such that the potential of the first node N1 may not decrease due to the current leakage. Accordingly, the first node N1 may not be in the floating state during the non-scanning period.

When the shift register recovers from the non-scanning period to the scanning period and is operated normally to output the scanning signal to the gate line, because the potential of the first node N1 maintains the high potential and does not decrease due to the current leakage, the eighth transistor T8 may transmit the signal at the first clock signal terminal CK1 to the gate signal output terminal GOUT under the control of the high-level signal at the first node N1, enabling the shift register to normally output the scanning signal to the gate line. Accordingly, the abnormal output signal at the shift register may be suppressed when the shift register reenters the scanning period, and the phenomenon of the dark lines may be improved.

In addition, during the charging period of the second node N2 in the non-scanning period, i.e., during the T4 stage in which the shift register suspends the output of the scanning signal, the high-level signal at the second control terminal CN2 may control the second transistor T2 to be switched on, and the high-level signal at the second fixed voltage terminal V2 may continuously charge the second node N2, and maintain the high-level at the second node N2, such that the potential at the second node N2 may not decrease due to the current leakage. Accordingly, the second node N2 may not be in the floating state during the non-scanning period.

When the shift register recovers from the non-scanning period to the scanning period to be operated normally to output the scanning signal to the gate line, because the potential of the second node N2 maintains the high potential and does not decrease due to the current leakage, the seventh transistor T7 may transmit the love-level signal at the first reference voltage terminal VGL to the gate signal output terminal GOUT under the control of the high-level signal at the second node N2. Thus, the signal received by the gate line may be promptly changed from the high-level scanning signal received in the T3 stage to the low-level signal. Accordingly, the display abnormality caused by the prolonged time of receiving the scanning signal may be prevented, the abnormal output signal when the shift register reenters the scanning period may be suppressed, and the phenomenon of bright lines may be improved.

Compared with the existing shift register, only extra three transistors may be introduced to the disclosed shift register, and the circuit structure may simple and easy to implement. Further, compared with the existing shift register, the timing diagram or the driving scheme of the disclosed shift register may remain substantially the same and, thus, the driving chip in the prior art may still be used, and the cost may be reduced.

Figure 9:
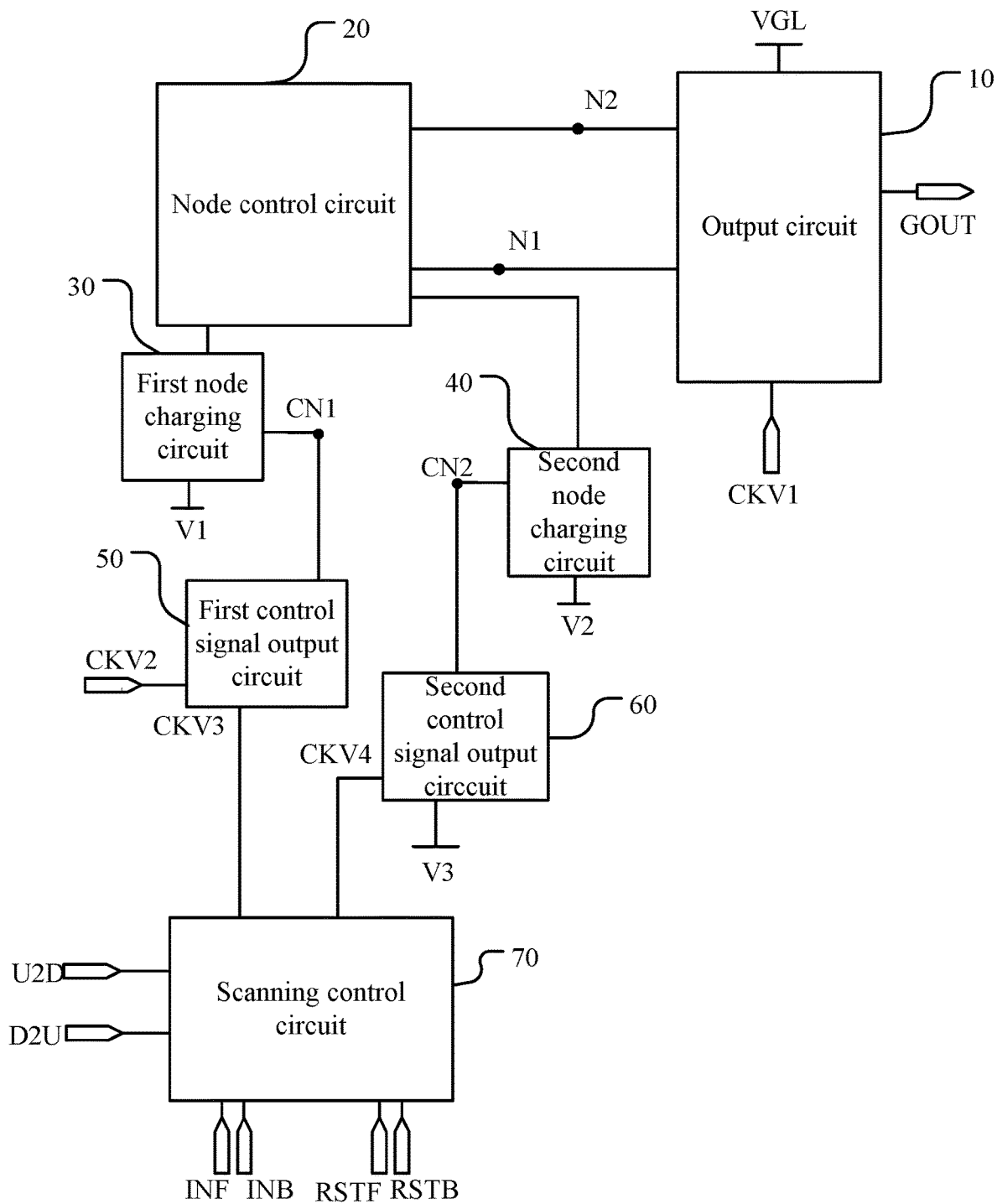
FIG. 9 illustrates a schematic diagram of another exemplary shift register consistent with disclosed embodiments.

FIG. 9 illustrates a schematic diagram of another exemplary shift register consistent with disclosed embodiments. The similarities between FIG. 9 and FIG. 5 are not repeated here, while certain differences may be explained.

As shown in FIG. 9, the shift register may further include a scanning control circuit 70. Under the control of a forward scanning control signal terminal U2D, the scanning control circuit 70 may provide the signal at a forward scanning input terminal INF to the third clock signal terminal CKV3, and provide the signal at a forward scanning reset signal terminal RSTF to the fourth clock signal terminal CKV4. In addition, under the control of a backward scanning control signal terminal D2U, the scanning control circuit 70 may provide the signal at a backward scanning input terminal INB to the third clock signal terminal CKV3, and provide the signal at a backward scanning reset signal terminal RSTB to the fourth clock signal terminal CKV4.

In the disclosed embodiments, through configuring the scanning control circuit 70 in the shift register, the shift register may be able to realize the forward scanning and backward scanning function, thereby meeting the desires of different application scenarios.

Figure 10:
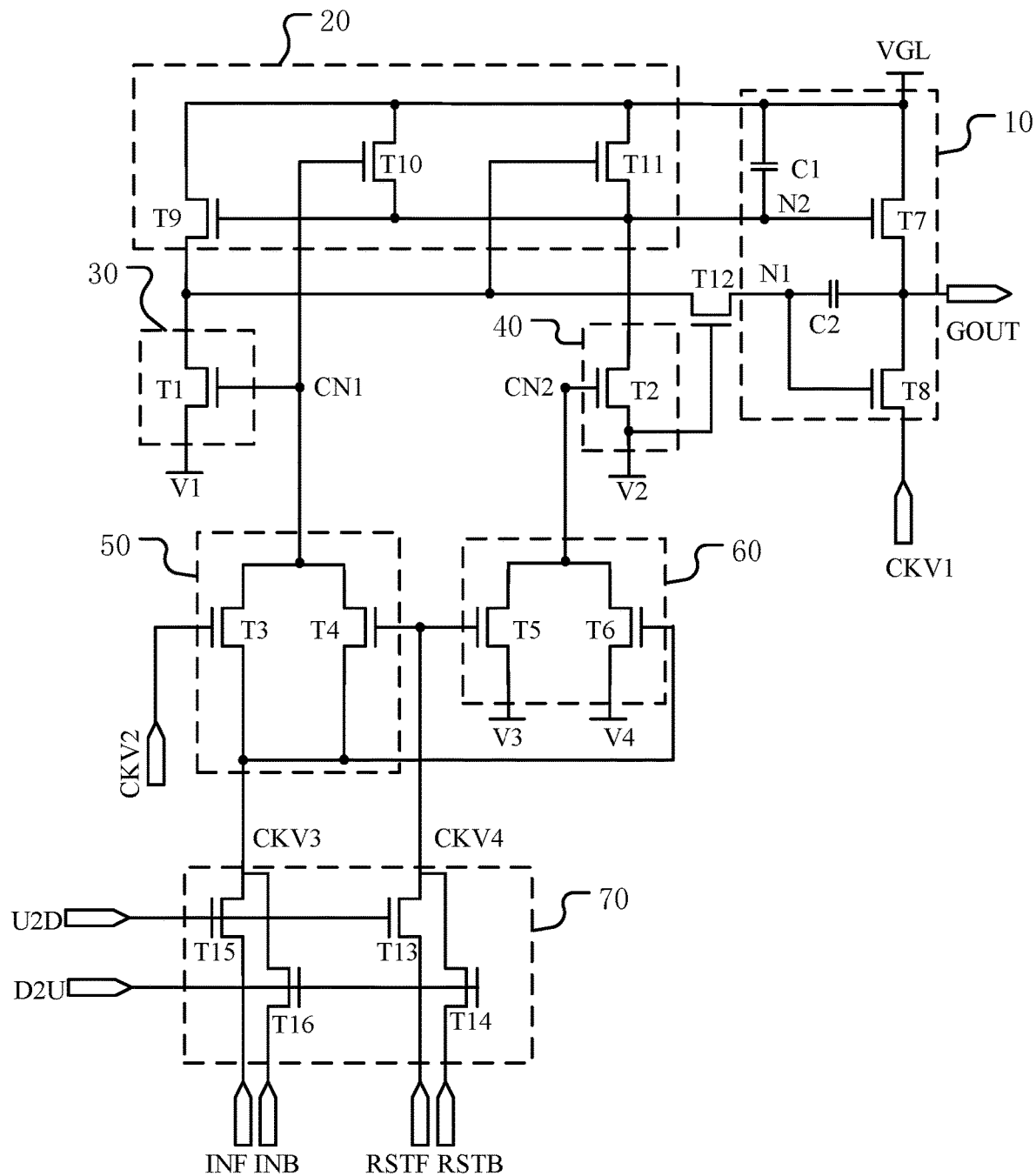
FIG. 10 illustrates a circuit diagram of another exemplary shift register consistent with disclosed embodiments.

FIG. 10 illustrates a circuit diagram of another exemplary shift register consistent with disclosed embodiments. The similarities between FIG. 10 and FIG. 6 are not repeated here, while certain differences may be explained.

As shown in FIG. 10, the shift register may further include a scanning control circuit 70, which may include a thirteenth transistor T13, a fourteenth transistor T14, a fifteenth transistor T15, and a sixteenth transistor T16.

A gate electrode of the thirteenth transistor T13 may be electrically connected to the forward scanning control signal terminal U2D, a first electrode of the thirteenth transistor T13 may be electrically connected to the forward scanning reset signal terminal RSTF, and a second electrode of the thirteenth transistor T13 may be electrically connected to the fourth clock signal terminal CKV4.

A gate electrode of the fourteenth transistor T14 may be electrically connected to the backward scanning control signal terminal D2U, a first electrode of the fourteenth transistor T14 may be electrically connected to the backward scanning reset signal terminal RSTB, and a second terminal electrode of the fourteenth transistor T14 may be electrically connected to the fourth clock signal terminal CKV4.

A gate electrode of the fifteenth transistor T15 may be electrically connected to the forward scanning control signal terminal U2D, a first electrode of the fifteenth transistor T15 may be electrically connected to the forward scanning input signal terminal INF, and a second electrode of the fifteenth transistor T15 may be electrically connected to the third clock signal terminal CKV3.

A gate electrode of the sixteenth transistor T16 may be electrically connected to the backward scanning control signal terminal D2U, a first electrode of the sixteenth transistor T16 may be electrically connected to the backward scanning input signal terminal INB, and a second electrode of the sixteenth transistor T16 may be electrically connected to the third clock signal terminal CKV3.

In the disclosed embodiments, an exemplary circuit structure of the scanning control circuit 70 is provided, and the scanning control circuit 70 may provide an electrical signal to the third clock signal terminal CKV3 and the fourth clock signal terminal CKV4, thereby controlling the shift register to implement forward scanning and backward scanning function.

The present disclosure further provides a driving circuit comprising N number of cascaded shift registers, where N is a positive integer greater than two. Each shift register in the N number of cascaded shift registers may be any one of the disclosed shift registers. The disclosed driving circuit may be applied to a display panel to drive a plurality of gate lines in the display panel.

Figure 11:
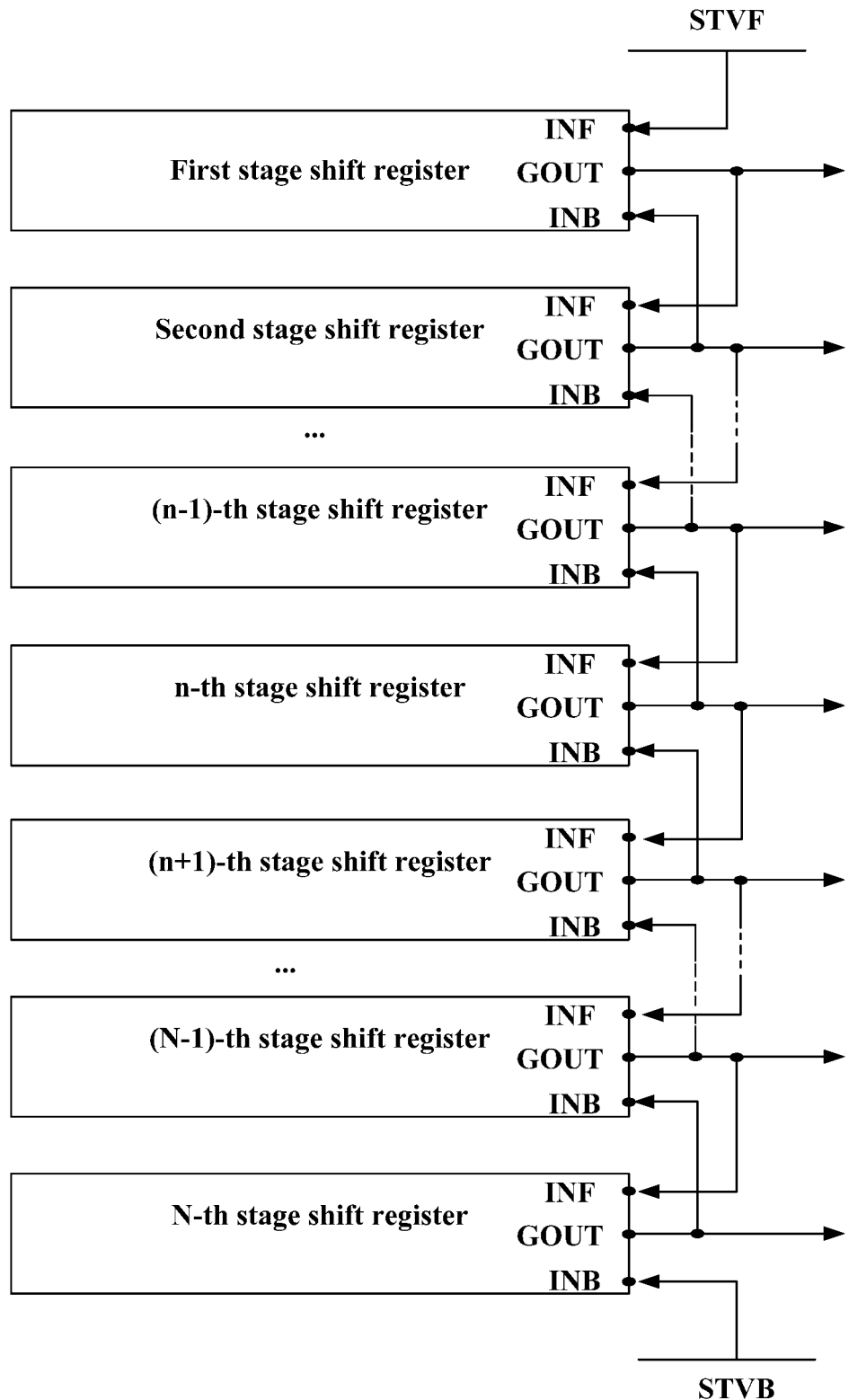
FIG. 11 illustrates a schematic diagram of an exemplary driving circuit consistent with disclosed embodiments.

FIG. 11 illustrates a schematic diagram of an exemplary driving circuit consistent with disclosed embodiments. As shown in FIG. 11, the driving circuit may comprise N cascaded shift registers, e.g., the first stage shift register to the N-th stage shift register, where N is a positive integer greater than two. The forward scanning input signal terminal INF of the first stage shift register may be coupled to a forward scanning frame trigger signal terminal STVF. Except the first stage shift register, the forward scanning input signal terminal INF of the n-th stage shift register may be coupled to the gate signal output terminal GOUT of the (n−1)-th stage shift register, and the forward scanning input signal terminal INF of the N-th stage shift register may be coupled to the gate signal output terminal GOUT of the (N−1)-th stage shift register, where n is an integer greater than or equal to 1 and less than or equal to N−1. Thus, the forward scanning driving may be realized.

In another embodiment, as shown in FIG. 11, in the driving circuit, the backward scanning input signal terminal INB of the N-th stage shift register may be coupled to the backward scanning frame trigger signal terminal STVB. Except the N-th stage shift register, the backward scanning input signal terminal INB of the (n−1)-th stage shift register may be coupled to the gate signal output terminal GOUT of the n-th stage shift register, and the backward scanning input signal terminal INB of the second stage shift register may be coupled to the gate signal output terminal GOUT of the first stage shift register is coupled. Thus, the backward scanning driving may be realized.

Further, to switch between the forward scanning driving and the backward scanning driving, as shown in FIG. 11, the forward scanning input signal end INF of the first stage shift register may be coupled to the forward scanning frame trigger signal terminal STVF. Except the first stage shift register, the forward scanning input signal terminal INF of the n-th shift register may be coupled to the gate signal output terminal GOUT of the (n−1)-th stage shift register, and the forward scanning input signal terminal INF of the N-th stage shift register may be coupled to the gate signal output terminal GOUT of the (N−1) th stage shift register. Meanwhile, the backward scanning input signal terminal INB of the N-th stage shift register may be coupled to the backward scanning frame trigger signal terminal STVB. Except the N-th stage shift register, the backward scanning input signal terminal of the (n−1)-th stage shift register INB may be coupled to the gate signal output terminal GOUT of the n-th stage shift register, and the backward scanning input signal terminal INB of the first stage shift register may be coupled to the gate signal output terminal GOUT of the second stage shift register. Thus, a switching between the forward scanning driving and the backward scanning driving may be realized.

Further, each shift register in the disclosed driving circuit may have the same function and structure as any one of the disclosed shift registers, and the detail description of each shift register in the disclosed driving circuit will not be repeated.

Figure 12:
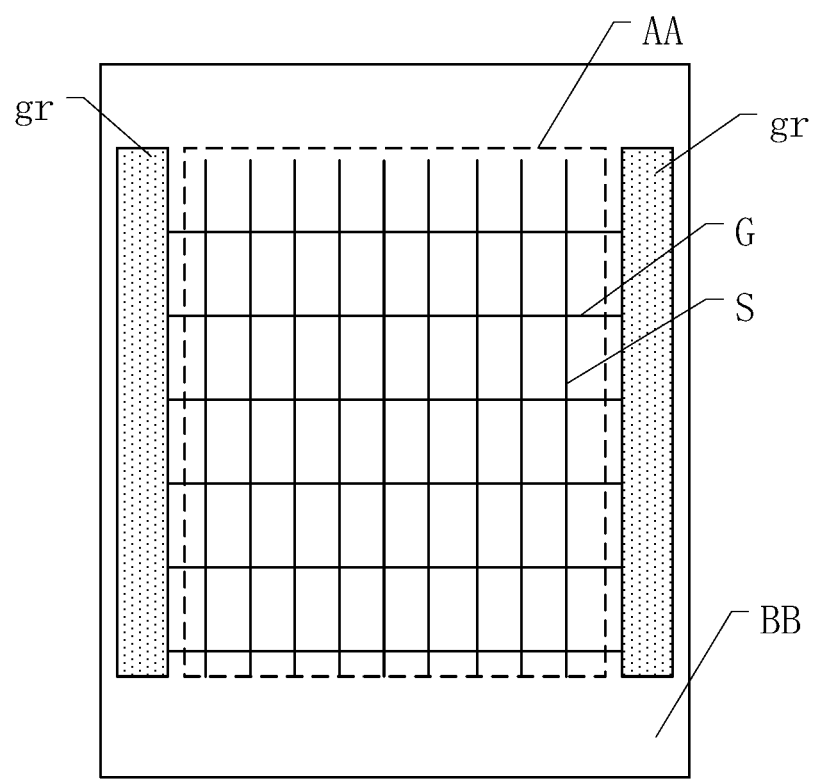
FIG. 12 illustrates a schematic diagram of an exemplary display device consistent with disclosed embodiments.

The present disclosure further provides a display device. FIG. 12 illustrates a schematic diagram of an exemplary display device consistent with disclosed embodiments.

Referring to FIG. 11 and FIG. 12, the display device may include a display area AA and a non-display area BB. The display area AA may include a plurality of gate lines G and a plurality of data line S intersecting and insulated from the gate lines G. The non-display area BB may include a driving circuit gr, which may be any one of the disclosed driving circuits. The gate signal output terminal GOUT of each shift register in the driving circuit gr may be electrically connected to a gate line G. The driving circuit gr is also called as a gate driving circuit.

In certain embodiments, the display device may include two driving circuits. In one embodiment, as shown in FIG. 12, a shift register in each of the two driving circuit may be connected to a corresponding gate line in the display panel, and the shift registers in the same stage of the two driving circuits may be connected to the same gate line. In another embodiment, the shift registers in one driving circuit may be connected to the odd-numbered gate lines in the display panel, and the shift registers in the other driving circuit maybe connected to the even-numbered gate lines in the display panel.

In certain other embodiments, the display device may include one driving circuit, and in certain other embodiments, the display device may include more than two driving circuits, which is not limited by the present disclosure.

The disclosed display device may be an array substrate, or may be a terminal display device, such as a mobile phone, a computer, a television, or other display device having a display function, which is not limited by the present disclosure. Because the disclosed display device includes any one of the disclosed driving circuits, the disclosed display device may also have the same features as the disclosed display device, which are not repeated here.

In the disclosed shift register, driving circuit and display device, through configuring the first node charging circuit in the shift register, during the charging period of the first node in the non-scanning period, under the control of the signal at the first control terminal, the first node charging circuit may provide the signal at the first fixed voltage terminal to the first node. Thus, the first node may be no longer in the floating state during the non-scanning period, and the electrical signal at the first fixed voltage terminal may be able to continuously charge the first node, thereby maintaining the potential at the first node N1. That is, the potential at the first node may not decrease due to the current leakage.

When the shift register recovers from the non-scanning period to the scanning period to be normally operated to output the scanning signal to the gate line, because the potential at the first node remains substantially the same under the influence of the first node charging circuit, the output circuit may be able to provide the signal at the first clock signal terminal to the gate signal output terminal under the control of the signal at the first node. Thus, the shift register may normally output the scanning signal to the gate line. Accordingly, the abnormal output signal at the gate signal output terminal of the shift register may be suppressed when the shift register reenters the scanning period, and the phenomenon of the dark lines may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A shift register, comprising:
an output circuit, wherein the output circuit provides a signal at a first clock signal terminal to a gate signal output terminal under a control of a signal at a first node, or provides a signal at a first reference voltage terminal to the gate signal output terminal under a control of a signal at a second node;
a node control circuit, wherein according to the signal at the first node or the signal at the second node, the node control circuit controls a level of the signal at the first node to be opposite to a level of the signal at the second node;
a first node charging circuit, where the first node charging circuit includes a first control terminal, during a charging period of the first node in a non-scanning period, the first node charging circuit provides a signal at a first fixed voltage terminal to the first node under a control of a signal at the first control terminal;
a second node charging circuit, wherein the second node charging circuit includes a second control terminal and during a charging period of the second node in the non-scanning period, under a control of a signal at the second control terminal, the second node charging circuit provides a signal at a second fixed voltage terminal to the second node; and
a first control signal output circuit, wherein under a control of a signal at a second clock signal terminal, the first control signal output circuit transmits a signal at a third clock signal terminal to the first control terminal, and the first node charging circuit provides the signal at the first fixed voltage terminal to the first node.

2. The shift register according to claim 1, further comprising:
a second control signal output circuit,
wherein under a control of a signal at a fourth clock signal terminal, the second control signal output circuit transmits a signal at a third fixed voltage terminal to the second control terminal, and the second node charging circuit provides the signal at the second fixed voltage terminal to the second node.

3. The shift register according to claim 1, wherein:
the first node charging circuit includes a first transistor; and
a gate electrode of the first transistor is electrically connected to the first control terminal, a first electrode of the first transistor is electrically connected to the first fixed voltage terminal, and a second electrode of the first transistor is electrically connected to the first node.

4. The shift register according to claim 1, wherein:
the first control signal output circuit include a third transistors and a fourth transistor;
a gate electrode of the third transistor is electrically connected to the second clock signal terminal, a first electrode of the third transistor is electrically connected to the third clock signal terminals, and a second electrode of the third transistor is electrically connected to the first control terminal; and
a gate electrode of the fourth transistor is electrically connected to a fourth clock signal terminal, a first electrode of the fourth transistor is electrically connected to the third clock signal terminals, and a second electrode of the fourth transistor is electrically connected to the first control terminal.

5. The shift register according to claim 1, wherein:
the second node charging circuit includes a second transistor; and
a gate electrode of the second transistor is electrically connected to the second control terminal, a first electrode of the second transistor is electrically connected to the second fixed voltage terminal, and a second electrode of the second transistor is electrically connected to the second node.

6. The shift register according to claim 2, wherein:
the second control signal output circuit includes a fifth transistor and a sixth transistor;
a gate electrode of the fifth transistor is electrically connected to the fourth clock signal terminal, a first electrode of the fifth transistor is electrically connected to the third fixed voltage terminal, and a second electrode of the fifth transistor is electrically connected to the second control terminal; and
a gate electrode of the sixth transistor is electrically connected to the third clock signal terminal, a first electrode of the sixth transistor is electrically connected to a fourth fixed voltage terminal, and a second electrode of the sixth transistor is electrically connected to the second control terminal.

7. The shift register according to claim 1, wherein:
the output circuit includes a seventh transistor, an eighth transistor, a first capacitor, and a second capacitor;
a gate electrode of the seventh transistor is electrically connected to the second node, a first electrode of the seventh transistor is electrically connected to the first reference voltage terminal, and a second electrode of the seventh transistor is electrically connected to the gate signal output terminal;
a first plate of the first capacitor is electrically connected to the first reference voltage terminal, and a second plate of the first capacitor is electrically connected to the second node;
a gate electrode of the eighth transistor is electrically connected to the first node, a first electrode of the eighth transistor is electrically connected to the first clock signal terminal, and a second electrode of the eighth transistor is electrically connected to the gate signal output terminal; and
a first plate of the second capacitor is electrically connected to the first node, and a second plate of the second capacitor is electrically connected to the gate signal output terminal.

8. The shift register according to claim 1, wherein:
the node control circuit includes a ninth transistor, a tenth transistor and an eleventh transistor;
a gate electrode of the ninth transistor is electrically connected to the second node, a first electrode of the ninth transistor is electrically connected to the first reference voltage terminal, and a second electrode of the ninth transistor is electrically connected to the first node;
a gate electrode of the tenth transistor is electrically connected to the first control terminal, a first electrode of the tenth transistor is electrically connected to the first reference voltage terminal, and a second electrode of the tenth transistor is electrically connected to the second node; and
a gate electrode of the eleventh transistor is electrically connected to the first node, a first electrode of the eleventh transistor is electrically connected to the first reference voltage terminal, and a second electrode of the eleventh transistor is electrically connected to the second node.

9. The shift register according to claim 1, further comprising:
a twelfth transistor,
wherein the first node is divided into a first sub-node and a second sub-node by the twelfth transistor,
a first electrode of the twelfth transistor is electrically connected to the first sub-node, a second of the twelfth transistor is electrically connected to the second sub-node, and a gate electrode of the twelfth transistor is electrically connected to a fifth fixed voltage terminal; and
a signal at the fifth fixed voltage terminal controls the twelfth transistor to be always switched-on.

10. The shift register according to claim 2, further comprising:
a scanning control circuit,
wherein under a control of a forward scanning control signal terminal, the scanning control circuit provides a signal at a forward scanning input terminal to the third clock signal terminal, and provides a signal at a forward scanning reset signal terminal to the fourth clock signal terminal, and
under a control of a backward scanning control signal terminal, the scanning control circuit provides a signal at a backward scanning input terminal to the third clock signal terminal, and provides a signal at a backward scanning reset signal terminal to the fourth clock signal terminal.

11. The shift register according to claim 10, wherein:
the scanning control circuit includes a thirteenth transistor, a fourteenth transistor, a fifteenth transistor, and a sixteenth transistor;
a gate electrode of the thirteenth transistor is electrically connected to the forward scanning control signal terminal, a first electrode of the thirteenth transistor is electrically connected to the forward scanning reset signal terminal, and a second electrode of the thirteenth transistor is electrically connected to the fourth clock signal terminal;
a gate electrode of the fourteenth transistor is electrically connected to the backward scanning control signal terminal, a first electrode of the fourteenth transistor is electrically connected to the backward scanning reset signal terminal, and a second terminal electrode of the fourteenth transistor is electrically connected to the fourth clock signal terminal;
a gate electrode of the fifteenth transistor is electrically connected to the forward scanning control signal terminal, a first electrode of the fifteenth transistor is electrically connected to the forward scanning input signal terminal, and a second electrode of the fifteenth transistor is electrically connected to the third clock signal terminal; and
a gate electrode of the sixteenth transistor is electrically connected to the backward scanning control signal terminal, a first electrode of the sixteenth transistor is electrically connected to the backward scanning input signal terminal, and a second electrode of the sixteenth transistor is electrically connected to the third clock signal terminal.

12. The shift register according to claim 1, wherein the gate signal output terminal outputs the signal at the first reference voltage terminal and the signal at the first clock signal terminal alternatively.

13. A driving circuit, comprising:
N number of cascaded shift registers, where N is a positive integer greater than two,
wherein a shift register of the N number of cascaded shift registers comprises:
an output circuit, wherein the output circuit provides a signal at a first clock signal terminal to a gate signal output terminal under a control of a signal at a first node, or provides a signal at a first reference voltage terminal to the gate signal output terminal under a control of a signal at a second node;
a node control circuit, wherein according to the signal at the first node or the signal at the second node, the node control circuit controls a level of the signal at the first node to be opposite to a level of the signal at the second node;
a first node charging circuit, where the first node charging circuit includes a first control terminal, during a charging period of the first node in a non-scanning period, the first node charging circuit provides a signal at a first fixed voltage terminal to the first node under a control of a signal at the first control terminal; and
a first control signal output circuit, wherein under a control of a signal at a second clock signal terminal, the first control signal output circuit transmits a signal at a third clock signal terminal to the first control terminal, and the first node charging circuit provides the signal at the first fixed voltage terminal to the first node.

14. The driving circuit according to claim 13, wherein the shift register of the N number of cascaded shift registers further comprises:
a second node charging circuit,
wherein the second node charging includes a second control terminal, and
during a charging period of the second node in the non-scanning period, under a control of a signal at the second control terminal, the second node charging circuit provides a signal at a second fixed voltage terminal to the second node.

15. A display device, comprising:
a display region including a plurality of gate lines and a plurality of data line intersecting and insulated from the gate lines; and
a non-display region including a driving circuit,
wherein the driving circuit comprises:
N number of cascaded shift registers, where N is a positive integer greater than two,
wherein a shift register of the N number of cascaded shift registers comprises:
an output circuit, wherein the output circuit provides a signal at a first clock signal terminal to a gate signal output terminal under a control of a signal at a first node, or provides a signal at a first reference voltage terminal to the gate signal output terminal under a control of a signal at a second node;
a node control circuit, wherein according to the signal at the first node or the signal at the second node, the node control circuit controls a level of the signal at the first node to be opposite to a level of the signal at the second node;
a first node charging circuit, where the first node charging circuit includes a first control terminal, during a charging period of the first node in a non-scanning period, the first node charging circuit provides a signal at a first fixed voltage terminal to the first node under a control of a signal at the first control terminal; and
a first control signal output circuit, wherein under a control of a signal at a second clock signal terminal, the first control signal output circuit transmits a signal at a third clock signal terminal to the first control terminal, and the first node charging circuit provides the signal at the first fixed voltage terminal to the first node, and
wherein the gate signal output terminal the shift register is electrically connected to a correspond gate line of the plurality of gate lines.

16. The display device according to claim 15, wherein the shift register of the N number of cascaded shift registers further comprises:
a second node charging circuit,
wherein the second node charging includes a second control terminal, and
during a charging period of the second node in the non-scanning period, under a control of a signal at the second control terminal, the second node charging circuit provides a signal at a second fixed voltage terminal to the second node.

* * * * *